US011539352B2

(12) United States Patent
Miller et al.

(10) Patent No.: US 11,539,352 B2
(45) Date of Patent: *Dec. 27, 2022

(54) TRANSFORMER RESONANT CONVERTER

(71) Applicant: Eagle Harbor Technologies, Inc., Seattle, WA (US)

(72) Inventors: Kenneth E. Miller, Seattle, WA (US); James R. Prager, Seattle, WA (US); Timothy M. Ziemba, Bainbridge Island, WA (US); John G. Carscadden, Seattle, WA (US); Ilia Slobodov, Seattle, WA (US); Alex Patrick Henson, Seattle, WA (US)

(73) Assignee: Eagle Harbor Technologies, Inc., Seattle, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/163,331

(22) Filed: Jan. 29, 2021

(65) Prior Publication Data

US 2021/0152163 A1    May 20, 2021

Related U.S. Application Data

(63) Continuation-in-part of application No. 16/903,374, filed on Jun. 16, 2020, now Pat. No. 11,159,156, and (Continued)

(51) Int. Cl.
*H02M 3/335* (2006.01)
*H03K 3/57* (2006.01)
(Continued)

(52) U.S. Cl.
CPC .......... *H03K 3/57* (2013.01); *H02M 3/33573* (2021.05); *H03K 17/005* (2013.01); *H03K 17/56* (2013.01)

(58) Field of Classification Search
CPC .......... H02M 3/00; H02M 3/003; H02M 3/01; H02M 3/015; H02M 3/22; H02M 3/24;
(Continued)

(56) References Cited

U.S. PATENT DOCUMENTS 4,070,589 A    1/1978 Martinkovic
4,438,331 A    3/1984 Davis
(Continued)

FOREIGN PATENT DOCUMENTS

CA    2292526 A1    12/1999
CN    101534071 A    9/2009
(Continued)

OTHER PUBLICATIONS

Bland, M.J., et al., "A High Power RF Power Supply for High Energy Physics Applications," Proceedings of 2005 the Particle Accelerator Conference, IEEE pp. 4018-4020 (May 16-20, 2005).
(Continued)

*Primary Examiner* — Thienvu V Tran
*Assistant Examiner* — Carlos O Rivera-Perez

(57) ABSTRACT

Some embodiments may include a nanosecond pulser comprising a plurality of solid state switches; a transformer having a stray inductance, $L_s$, a stray capacitance, $C_s$, and a turn ratio n; and a resistor with a resistance, R, in series between the transformer and the switches. In some embodiments, the resonant circuit produces a Q factor according to $$Q = \frac{1}{R}\sqrt{\frac{L_s}{C_s}};$$

and the nanosecond pulser produces an output voltage $V_{out}$ from an input voltage $V_{in}$, according to $V_{out}=QnV_{in}$.

26 Claims, 8 Drawing Sheets

Related U.S. Application Data a continuation-in-part of application No. 16/555,948, filed on Aug. 29, 2019, now Pat. No. 10,978,955, which is a continuation-in-part of application No. 16/523,840, filed on Jul. 26, 2019, now Pat. No. 10,892,140, application No. 17/163,331, which is a continuation-in-part of application No. 16/457,791, filed on Jun. 29, 2019, now Pat. No. 10,985,740, said application No. 16/555,948 is a continuation-in-part of application No. 16/250,157, filed on Jan. 17, 2019, now Pat. No. 10,734,906, said application No. 16/903,374 is a continuation of application No. 15/945,722, filed on Apr. 4, 2018, now Pat. No. 10,707,864, said application No. 16/457,791 is a continuation of application No. 15/921,650, filed on Mar. 15, 2018, now Pat. No. 10,382,022, application No. 17/163,331, which is a continuation-in-part of application No. 15/889,586, filed on Feb. 6, 2018, now Pat. No. 11,171,568, said application No. 16/250,157 is a continuation of application No. 15/623,464, filed on Jun. 15, 2017, now Pat. No. 10,224,822, said application No. 15/921,650 is a continuation of application No. 14/798,154, filed on Jul. 13, 2015, now Pat. No. 10,020,800, said application No. 15/623,464 is a continuation of application No. 14/635,991, filed on Mar. 2, 2015, now Pat. No. 9,706,630, said application No. 15/945,722 is a continuation of application No. 14/542,487, filed on Nov. 14, 2014, now Pat. No. 9,960,763, said application No. 14/798,154 is a continuation of application No. 14/542,487, filed on Nov. 14, 2014, now Pat. No. 9,960,763.

(60) Provisional application No. 62/789,526, filed on Jan. 8, 2019, provisional application No. 62/789,523, filed on Jan. 8, 2019, provisional application No. 62/717,523, filed on Aug. 10, 2018, provisional application No. 62/711,468, filed on Jul. 27, 2018, provisional application No. 62/711,334, filed on Jul. 27, 2018, provisional application No. 62/711,347, filed on Jul. 27, 2018, provisional application No. 62/711,464, filed on Jul. 27, 2018, provisional application No. 62/711,467, filed on Jul. 27, 2018, provisional application No. 62/711,406, filed on Jul. 27, 2018, provisional application No. 62/711,457, filed on Jul. 27, 2018, provisional application No. 62/456,060, filed on Feb. 7, 2017, provisional application No. 62/023,708, filed on Jul. 11, 2014, provisional application No. 61/946,457, filed on Feb. 28, 2014, provisional application No. 61/904,278, filed on Nov. 14, 2013.

(51) Int. Cl.
*H03K 17/56* (2006.01)
*H03K 17/00* (2006.01)

(58) Field of Classification Search
CPC ........ H02M 3/28; H02M 3/315; H02M 3/325; H02M 3/335; H02M 3/33507; H02M 3/33515; H02M 3/33523; H02M 3/33592; H02M 3/3376; H02M 3/33569; H02M 3/33571; H02M 3/33573; H02M 3/33576; H02M 3/33584; H02M 1/42; H02M 1/4208; H02M 1/4233; H02M 1/4241; H02M 1/0003; H02M 1/0048; H02M 1/0054; H02M 1/0058; H02M 1/0064; H03K 3/57; H03K 3/53; H03K 17/005; H03K 17/56; H01J 37/32137; H01J 37/32146; H01J 37/3467; Y02P 80/10; Y02P 80/112; Y02P 80/116; Y02B 70/10
USPC .......... 363/15–21.3, 40–43, 74, 95–99, 123, 363/131–139; 323/205–211, 223–226, 323/271–275, 282–285, 351
See application file for complete search history.

(56) References Cited

U.S. PATENT DOCUMENTS

| | | |
|---|---|---|
| 4,504,895 A | 3/1985 | Steigerwald |
| 4,885,074 A | 12/1989 | Susko et al. |
| 4,924,191 A | 5/1990 | Erb et al. |
| 4,992,919 A | 2/1991 | Lee et al. |
| 5,072,191 A | 12/1991 | Nakajima et al. |
| 5,118,969 A | 6/1992 | Ikezi et al. |
| 5,140,510 A | 8/1992 | Myers |
| 5,313,481 A | 5/1994 | Cook et al. |
| 5,321,597 A | 6/1994 | Alacoque |
| 5,325,021 A | 6/1994 | Duckworth et al. |
| 5,392,043 A | 2/1995 | Ribner |
| 5,451,846 A | 9/1995 | Peterson et al. |
| 5,488,552 A | 1/1996 | Sakamoto et al. |
| 5,610,452 A | 3/1997 | Shimer et al. |
| 5,623,171 A | 4/1997 | Nakajima |
| 5,656,123 A | 8/1997 | Salimian et al. |
| 5,729,562 A | 3/1998 | Birx et al. |
| 5,796,598 A | 8/1998 | Nowak et al. |
| 5,808,504 A | 9/1998 | Chikai et al. |
| 5,905,646 A | 5/1999 | Crewson et al. |
| 5,930,125 A | 7/1999 | Hitchcock et al. |
| 5,933,335 A | 8/1999 | Hitchcock et al. |
| 5,968,377 A | 10/1999 | Yuasa et al. |
| 6,059,935 A | 5/2000 | Spence |
| 6,066,901 A | 5/2000 | Burkhart et al. |
| 6,087,871 A | 7/2000 | Kardo-Syssoev et al. |
| 6,205,074 B1 | 3/2001 | Van Buskirk et al. |
| 6,233,161 B1 | 5/2001 | Balakrishnan et al. |
| 6,238,387 B1 | 5/2001 | Miller, III |
| 6,253,704 B1 | 7/2001 | Savas |
| 6,359,542 B1 | 3/2002 | Widmayer et al. |
| 6,362,604 B1 | 3/2002 | Cravey |
| 6,392,187 B1 | 5/2002 | Johnson |
| 6,480,399 B2 | 11/2002 | Balakrishnan et al. |
| 6,483,731 B1 | 11/2002 | Isurin et al. |
| 6,496,047 B1 | 12/2002 | Iskander et al. |
| 6,577,135 B1 | 6/2003 | Matthews et al. |
| 6,741,120 B1 | 5/2004 | Tan |
| 6,741,484 B2 | 5/2004 | Crewson et al. |
| 6,831,377 B2 | 12/2004 | Yampolsky et al. |
| 6,897,574 B2 | 5/2005 | Vaysse |
| 6,947,300 B2 | 9/2005 | Pai et al. |
| 7,061,230 B2 | 6/2006 | Kleine et al. |
| 7,180,082 B1 | 2/2007 | Hassanein et al. |
| 7,256,637 B2 | 8/2007 | Iskander et al. |
| 7,291,545 B2 | 11/2007 | Collins et al. |
| 7,307,375 B2 | 12/2007 | Smith et al. |
| 7,319,579 B2 | 1/2008 | Inoue et al. |
| 7,354,501 B2 | 4/2008 | Gondhalekar et al. |
| 7,396,746 B2 | 7/2008 | Walther et al. |
| 7,492,138 B2 | 2/2009 | Zhang et al. |
| 7,512,433 B2 | 3/2009 | Bernhart et al. |
| 7,521,370 B2 | 4/2009 | Hoffman |
| 7,601,619 B2 | 10/2009 | Okumura et al. |
| 7,605,385 B2 | 10/2009 | Bauer |
| 7,767,433 B2 | 8/2010 | Kuthi et al. |
| 7,901,930 B2 | 3/2011 | Kuthi et al. |
| 7,936,544 B2 | 5/2011 | Beland |
| 7,948,185 B2 | 5/2011 | Smith et al. |
| 7,989,987 B2 | 8/2011 | McDonald |
| 8,093,979 B2 | 1/2012 | Wilson |
| 8,115,343 B2 | 2/2012 | Sanders et al. |
| 8,129,653 B2 | 3/2012 | Kirchmeier et al. |
| 8,143,790 B2 | 3/2012 | Smith et al. |
| 8,222,936 B2 | 7/2012 | Friedman et al. |

(56) References Cited

U.S. PATENT DOCUMENTS

| | | | |
|---|---|---|---|
| 8,259,476 B2 | 9/2012 | Ben-Yaakov et al. | |
| 8,410,889 B2* | 4/2013 | Garrity | H01F 27/306 336/208 |
| 8,436,602 B2 | 5/2013 | Sykes | |
| 8,450,985 B2 | 5/2013 | Gray et al. | |
| 8,575,843 B2 | 11/2013 | Moore et al. | |
| 8,723,591 B2 | 5/2014 | Lee et al. | |
| 8,773,184 B1 | 7/2014 | Petrov et al. | |
| 8,847,433 B2 | 9/2014 | Vandermey | |
| 8,963,377 B2 | 2/2015 | Ziemba et al. | |
| 9,067,788 B1 | 6/2015 | Spielman et al. | |
| 9,070,396 B1 | 6/2015 | Katchmart et al. | |
| 9,084,334 B1 | 7/2015 | Getter et al. | |
| 9,122,350 B2 | 9/2015 | Kao et al. | |
| 9,287,086 B2 | 3/2016 | Brouk et al. | |
| 9,287,092 B2 | 3/2016 | Brouk et al. | |
| 9,306,533 B1 | 4/2016 | Mavretic | |
| 9,329,256 B2 | 5/2016 | Dolce | |
| 9,417,739 B2 | 8/2016 | Cordeiro et al. | |
| 9,435,029 B2 | 9/2016 | Brouk et al. | |
| 9,493,765 B2 | 11/2016 | Krishnaswamy et al. | |
| 9,601,283 B2 | 3/2017 | Ziemba et al. | |
| 9,706,630 B2 | 7/2017 | Miller et al. | |
| 9,767,988 B2 | 9/2017 | Brouk et al. | |
| 9,960,763 B2 | 5/2018 | Miller et al. | |
| 10,009,024 B2 | 6/2018 | Gan et al. | |
| 10,020,800 B2 | 7/2018 | Prager et al. | |
| 10,027,314 B2 | 7/2018 | Prager et al. | |
| 10,224,822 B2 | 3/2019 | Miller et al. | |
| 10,301,587 B2 | 5/2019 | Krishnaswamy et al. | |
| 10,304,661 B2 | 5/2019 | Ziemba et al. | |
| 10,373,755 B2 | 8/2019 | Prager et al. | |
| 10,373,804 B2 | 8/2019 | Koh et al. | |
| 10,382,022 B2 | 8/2019 | Prager et al. | |
| 10,460,910 B2 | 10/2019 | Ziemba et al. | |
| 10,483,089 B2 | 11/2019 | Ziemba et al. | |
| 10,607,814 B2 | 3/2020 | Ziemba et al. | |
| 10,659,019 B2 | 5/2020 | Slobodov et al. | |
| 10,707,864 B2 | 7/2020 | Miller et al. | |
| 10,734,906 B2 | 8/2020 | Miller et al. | |
| 10,777,388 B2 | 9/2020 | Ziemba et al. | |
| 10,796,887 B2 | 10/2020 | Prager et al. | |
| 10,811,230 B2 | 10/2020 | Ziemba et al. | |
| 10,892,140 B2 | 1/2021 | Ziemba et al. | |
| 11,004,660 B2 | 5/2021 | Prager et al. | |
| 2001/0008552 A1 | 7/2001 | Harada et al. | |
| 2002/0016617 A1 | 2/2002 | Oldham | |
| 2002/0140464 A1 | 10/2002 | Yampolsky et al. | |
| 2002/0180276 A1 | 12/2002 | Sakuma et al. | |
| 2002/0186577 A1 | 12/2002 | Kirbie | |
| 2003/0021125 A1 | 1/2003 | Rufer et al. | |
| 2003/0071035 A1 | 4/2003 | Brailove | |
| 2003/0137791 A1 | 7/2003 | Amet et al. | |
| 2003/0169107 A1 | 9/2003 | LeChevalier | |
| 2003/0227280 A1* | 12/2003 | Vinciarelli | H02M 3/33592 323/265 |
| 2004/0085784 A1 | 5/2004 | Salama et al. | |
| 2004/0149217 A1 | 8/2004 | Collins et al. | |
| 2005/0152159 A1 | 7/2005 | Isurin et al. | |
| 2005/0270096 A1 | 12/2005 | Coleman | |
| 2006/0187607 A1 | 8/2006 | Mo | |
| 2006/0192774 A1 | 8/2006 | Yasumura | |
| 2006/0210020 A1 | 9/2006 | Takahashi et al. | |
| 2006/0274887 A1 | 12/2006 | Sakamoto et al. | |
| 2007/0018504 A1 | 1/2007 | Wiener et al. | |
| 2007/0114981 A1 | 5/2007 | Vasquez et al. | |
| 2007/0115705 A1 | 5/2007 | Gotzenberger et al. | |
| 2007/0212811 A1 | 9/2007 | Hanawa et al. | |
| 2008/0062733 A1 | 3/2008 | Gay | |
| 2008/0106151 A1 | 5/2008 | Ryoo et al. | |
| 2008/0143260 A1 | 6/2008 | Tuymer et al. | |
| 2008/0198634 A1 | 8/2008 | Scheel et al. | |
| 2008/0231337 A1 | 9/2008 | Krishnaswamy et al. | |
| 2008/0252225 A1 | 10/2008 | Kurachi et al. | |
| 2008/0272706 A1 | 11/2008 | Kwon et al. | |

| | | | |
|---|---|---|---|
| 2009/0016549 A1 | 1/2009 | French et al. | |
| 2009/0108759 A1 | 4/2009 | Tao et al. | |
| 2009/0322307 A1* | 12/2009 | Ide | H02J 50/12 323/355 |
| 2010/0007358 A1 | 1/2010 | Schaerrer et al. | |
| 2010/0148847 A1 | 6/2010 | Schurack et al. | |
| 2010/0284208 A1 | 11/2010 | Nguyen et al. | |
| 2011/0001438 A1 | 1/2011 | Chemel et al. | |
| 2011/0140607 A1 | 6/2011 | Moore et al. | |
| 2012/0016282 A1 | 1/2012 | Van Brunt et al. | |
| 2012/0052599 A1 | 3/2012 | Brouk et al. | |
| 2012/0081350 A1 | 4/2012 | Sano et al. | |
| 2012/0155613 A1 | 6/2012 | Caiafa et al. | |
| 2013/0027848 A1 | 1/2013 | Said | |
| 2013/0075390 A1 | 3/2013 | Ashida | |
| 2013/0113650 A1 | 5/2013 | Behbahani et al. | |
| 2013/0174105 A1 | 7/2013 | Nishio et al. | |
| 2013/0175575 A1 | 7/2013 | Ziemba et al. | |
| 2014/0009969 A1 | 1/2014 | Yuzurihara et al. | |
| 2014/0021180 A1 | 1/2014 | Vogel | |
| 2014/0077611 A1 | 3/2014 | Young et al. | |
| 2014/0109886 A1 | 4/2014 | Singleton et al. | |
| 2014/0118414 A1 | 5/2014 | Seo et al. | |
| 2014/0146571 A1 | 5/2014 | Ryoo et al. | |
| 2014/0268968 A1 | 9/2014 | Richardson | |
| 2014/0354343 A1 | 12/2014 | Ziemba et al. | |
| 2015/0028932 A1 | 1/2015 | Ziemba et al. | |
| 2015/0076372 A1 | 3/2015 | Ziemba et al. | |
| 2015/0084509 A1 | 3/2015 | Yuzurihara et al. | |
| 2015/0130525 A1 | 5/2015 | Miller et al. | |
| 2015/0155086 A1 | 6/2015 | Matsuura | |
| 2015/0256086 A1 | 9/2015 | Miller et al. | |
| 2015/0303914 A1 | 10/2015 | Ziemba et al. | |
| 2015/0311680 A1 | 10/2015 | Burrows et al. | |
| 2015/0318846 A1 | 11/2015 | Prager et al. | |
| 2016/0020072 A1 | 1/2016 | Brouk et al. | |
| 2016/0220670 A1 | 8/2016 | Kalghatgi et al. | |
| 2016/0241234 A1 | 8/2016 | Mavretic | |
| 2016/0269195 A1 | 9/2016 | Coenen et al. | |
| 2016/0327029 A1 | 11/2016 | Ziemba et al. | |
| 2016/0327089 A1 | 11/2016 | Adam et al. | |
| 2017/0083810 A1 | 3/2017 | Ielmini et al. | |
| 2017/0126049 A1 | 5/2017 | Pan et al. | |
| 2017/0154726 A1 | 6/2017 | Prager et al. | |
| 2017/0243731 A1 | 8/2017 | Ziemba et al. | |
| 2017/0294842 A1 | 10/2017 | Miller et al. | |
| 2017/0311431 A1 | 10/2017 | Park | |
| 2017/0359886 A1 | 12/2017 | Binderbauer et al. | |
| 2018/0226896 A1 | 8/2018 | Miller et al. | |
| 2018/0286636 A1 | 10/2018 | Ziemba et al. | |
| 2018/0315583 A1 | 11/2018 | Luere et al. | |
| 2018/0374689 A1 | 12/2018 | Abraham et al. | |
| 2019/0080884 A1 | 3/2019 | Ziemba et al. | |
| 2019/0157044 A1 | 5/2019 | Ziemba et al. | |
| 2019/0172685 A1 | 6/2019 | Van Zyl et al. | |
| 2019/0180982 A1 | 6/2019 | Brouk et al. | |
| 2019/0228952 A1 | 7/2019 | Dorf et al. | |
| 2019/0326092 A1 | 10/2019 | Ogasawara et al. | |
| 2019/0348258 A1 | 11/2019 | Koh et al. | |
| 2019/0393791 A1 | 12/2019 | Ziemba et al. | |
| 2020/0035458 A1 | 1/2020 | Ziemba et al. | |
| 2020/0051786 A1 | 2/2020 | Ziemba et al. | |
| 2021/0152163 A1 | 5/2021 | Miller et al. | |

FOREIGN PATENT DOCUMENTS

| | | |
|---|---|---|
| CN | 103458600 B | 7/2016 |
| CN | 106537776 A | 3/2017 |
| EP | 174164 A2 | 3/1986 |
| EP | 0947048 A1 | 10/1999 |
| EP | 1128557 A2 | 8/2001 |
| EP | 1515430 A1 | 3/2005 |
| JP | H09129621 A | 5/1997 |
| WO | 0193419 A1 | 12/2001 |
| WO | 2010069317 A1 | 6/2010 |
| WO | 2014036000 A1 | 3/2014 |
| WO | 2016171582 A1 | 10/2016 |
| WO | 2018186901 A1 | 10/2018 |

(56) References Cited

FOREIGN PATENT DOCUMENTS

OTHER PUBLICATIONS

Dammertz, G., et al., "Development of Multimegawatt Gyrotrons for Fusion Plasma Heating and current Drive," IEEE Transactions on Electron Devices, vol. 52, No. 5, pp. 808-817 (Apr. 2005) (Abstract).
Garwin, R., "Pulsed Power Peer Review Committee Report," Sandia National Laboratories Report, SAND2000-2515, pp. 3-38 (Oct. 2000).
Gaudei, J.A., et al., "Research issues in Developing Compact Pulsed Power for High Peak Power Applications on Mobile Platforms," Proceedings of the IEEE, vol. 92, No. 7, pp. 1144-1165 (Jul. 2004).
Goodman, E. A., "Characteristics of sheet windings in transformers", IEEE Engineering, vol. 82, No. 11, pp. 673-676 (Nov. 1963) (Abstract).
In, Y., et al., "On the roles of direct feedback and error field correction in stabilizing resistive-wall modes," Nuclear 2 Fusion, vol. 50, No. 4, pp. 1-5 (2010).
Kim, J.H., et al., "High Voltage Pulsed Power Supply Using IGBT Stacks," IEEE Transactions on Dielectrics and Electrical insulation, vol. 14, No. 4, pp. 921-926 (Aug. 2007).
Locher, R., "Introduction to Power MOSFETs and their Applications (Application Note 558)," Fairchild Semiconductor, 15 pages (Oct. 1998).
Locher, R.E., and Pathak, A.D., "Use of BiMOSFETs in Modem Radar Transmitters," IEEE International Conference on Power Electronics and Drive Systems, pp. 776-782 (2001).
Pokryvailo, A., et al., "A 1KW Pulsed Corona System for Pollution Control Applications," 14th IEEE International Pulsed Power Conference, Dallas, TX, USA (Jun. 15-18, 2003).
Pokryvailo, A., et al., "High-Power Pulsed Corona for Treatment of Pollutants in Heterogeneous Media," IEEE Transactions on Plasma Science, vol. 34, No. 5, pp. 1731-1743 (Oct. 2006) (Abstract).
Prager, J.R. et al., "A High Voltage Nanosecond Pulser with Variable Pulse Width and Pulse Repetition Frequency control for Nonequilibrium Plasma Applications", 41st International Conference on Plasma Sciences held with 2014 IEEE International Conference on High-Power Particle Beams, May 25-29, 2014, 6, Washington, D.C. (Abstract).
Quinley, M., et al., "High Voltage Nanosecond Pulser Operating at 30 kW and 400 kHz" APS-GEC-2018, 1 page (2018).
Rao, X., et al., "Combustion Dynamics of Plasma-Enhanced Premixed and Nonpremixed Flames," IEEE Transactions on Plasma Science, vol. 38, No. 12, pp. 3265-3271 (Dec. 2010).
Reass, W.A., et al., "Progress Towards a 20 KV, 2 KA Plasma Source Ion Implantation Modulator for Automotive Production of Diamond Film on Aluminum," Submitted to 22nd International Power Symposium, Boca Raton, FL, 6 pages (Jun. 24-27, 1996).
Sanders, J.M., et al., "Scalable, compact, nanosecond pulse generator with a high repetition rate for biomedical applications requiring intense electric fields," 2009 IEEE Pulsed Power Conference, Washington, DC, 2 pages (Jun. 28, 2009-Jul. 2, 2009) (Abstract).
Schamiloglu, E., et al., "Scanning the Technology: Modem Pulsed Power: Charlie Martin and Beyond," Proceedings of the IEEE, vol. 92, No. 7 , pp. 1014-1020 (Jul. 2004).
Scoville, J.T., et al., "The Resistive Wall Mode Feedback Control System on DIII-D," IEEE/NPSS 18th Symposium on fusion Engineering, Albuquerque, NM, Oct. 25-29, 1999, General Atomics Report GAA23256, 7 pages (Nov. 1999).
Singleton, D.R., et al., "Compact Pulsed-Power System for Transient Plasma Ignition," IEEE Transactions on Plasma Science, vol. 37, No. 12, pp. 2275-2279 (2009) (Abstract).
Singleton, D.R., et al., "Low Energy Compact Power Modulators for Transient Plasma Ignition," IEEE Transactions on Dielectrics and Electrical Insulation, vol. 18, No. 4, pp. 1084-1090 (Aug. 2011) (Abstract).

Starikovskiy, A. and Aleksandrov, N., "Plasma-assisted ignition and combustion," Progress in Energy and Combustion Science, vol. 39, No. 1, pp. 61-110 (Feb. 2013).
Wang, F., et al., "Compact High Repetition Rate Pseudospark Pulse Generator," IEEE Transactions on Plasma Science, vol. 33, No. 4, pp. 1177-1181 (Aug. 2005) (Abstract).
Zavadtsev, D.A., et al., "Compact Electron Linear Accelerator RELUS-5 for Radiation Technology Application," 10th European Particle Accelerator Conference, Edinburgh, UK, pp. 2385-2387 (Jun. 26-30, 2006).
Zhu, Z., et al., "High Voltage pulser with a fast fall-time for plasma immersion ion implantation," Review of Scientific Instruments, vol. 82, No. 4, p. 045102-1-045102-4 (Apr. 2011).
International Search Report and Written Opinion as issued in connection with International Patent Application No. PCT/US2014/040929, dated Sep. 15, 2014, 10 pages.
International Search Report and Written Opinion as issued in connection with International Patent Application No. PCT/US2014/065832, dated Feb. 20, 2015, 13 pages.
International Search Report and Written Opinion as issued in connection with International Patent Application No. PCT/US2015/018349, dated Jul. 14, 2015, 15 pages.
International Search Report and Written Opinion as issued in connection with International Patent Application No. PCT/US2015/040204, dated Oct. 6, 2015, 12 pages.
U.S. Non-Final Office Action in U.S. Appl. No. 14/542,487 dated Nov. 23, 2015, 11 pages.
U.S. Non-Final Office Action in U.S. Appl. No. 14/798,154 dated Jan. 5, 2016, 13 pages.
U.S. Final Office Action in U.S. Appl. No. 14/542,487 dated Feb. 12, 2016, 11 pages.
U.S. Non-Final Office Action in U.S. Appl. No. 14/542,487 dated Apr. 8, 2016, 12 pages.
U.S. Non Final Office Action in U.S. Appl. No. 14/635,991, dated Jul. 29, 2016, 17 pages.
U.S. Final Office Action in U.S. Appl. No. 14/798,154 dated Oct. 6, 2016, 14 pages.
U.S. Final Office Action in U.S. Appl. No. 14/542,487 dated Dec. 12, 2016, 13 pages.
U.S. Final Office Action in U.S. Appl. No. 14/635,991, dated Jan. 23, 2017, 22 pages.
U.S. Advisory Action in U.S. Appl. No. 14/542,487 dated Mar. 28, 2017, 03 pages.
U.S. Notice of Allowance in U.S. Appl. No. 14/635,991, dated May 4, 2017, 07 pages.
U.S. Non-Final Office Action in U.S. Appl. No. 14/798,154 dated May 26, 2017, 16 pages.
U.S. Non-Final Office Action in U.S. Appl. No. 14/542,487 dated Jun. 5, 2017, 12 pages.
Partial Supplementary European Search Report dated Jul. 28, 2017 in related foreign application No. 14861818.4, 12 Pages.
U.S. Non Final Office Action in U.S. Appl. No. 15/623,464, dated Nov. 7, 2017, 18 pages.
U.S. Final Office Action in U.S. Appl. No. 14/542,487 dated Dec. 19, 2017, 07 pages.
U.S. Final Office Action in U.S. Appl. No. 14/798,154 dated Dec. 28, 2017, 06 pages.
U.S. Notice of Allowance in U.S. Appl. No. 14/542,487 dated Mar. 21, 2018, 05 pages.
U.S. Final Office Action in U.S. Appl. No. 15/623,464, dated Mar. 27, 2018, 18 pages.
International Search Report and Written Opinion as issued in connection with International Patent Application No. PCT/US2018/016993, dated Apr. 18, 2018, 11 pages.
U.S. Non-Final Office Action in U.S. Appl. No. 15/889,586 dated Sep. 12, 2018, 18 pages.
U.S. Notice of Allowance in U.S. Appl. No. 14/798,154 dated Jun. 1, 2018, 05 pages.
International Search Report and Written Opinion as issued in connection with International Patent Application No. PCT/US2018/025440, dated Jun. 25, 2018, 25 pages.
U.S. Notice of Allowance in U.S. Appl. No. 16/555,948, dated Jan. 13, 2021, 7 pages.

(56) References Cited

OTHER PUBLICATIONS

U.S. Notice of Allowance in U.S. Appl. No. 16/457,791 dated Jan. 22, 2021, 7 pages.
International Search Report and written opinion received for PCT Patent Application No. PCT/US2020/60799, dated Feb. 5, 2021, 11 pages.
Extended European Search Report for Application No. 20195265.2 dated Mar. 17, 2021, 8 pages.
U.S. Notice of Allowance in U.S. Appl. No. 16/722,115, dated Apr. 1, 2021, 9 pages.
U.S. Notice of Allowance in U.S. Appl. No. 15/889,586 dated Apr. 14, 2021, 9 pages.
U.S. Non Final Office Action in U.S. Appl. No. 16/941,532, dated Apr. 14, 2021, 10 pages.
Extended European Search Report for Application No. 20200919.7 dated Apr. 30, 2021, 11 pages.
U.S. Non-Final Office Action in U.S. Appl. No. 16/722,115, dated May 3, 2021, 9 pages.
U.S. Non-Final Office Action in U.S. Appl. No. 15/889,586 dated Jun. 11, 2021, 11 pages.
U.S. Notice of Allowance in U.S. Appl. No. 15/623,464, dated Oct. 17, 2018, 7 pages.
International Search Report and Written Opinion as issued in connection with International Patent Application No. PCT/US2018/48206, dated Nov. 1, 2018, 10 pages.
U.S. Non Final Office Action in U.S. Appl. No. 15/941,731, dated Nov. 16, 2018, 17 pages.
U.S. Non-Final Office Action in U.S. Appl. No. 15/921,650 dated Nov. 28, 2018, 11 pages.
U.S. Non Final Office Action in U.S. Appl. No. 16/178,538, dated Jan. 11, 2019, 27 pages.
U.S. Non Final Office Action in U.S. Appl. No. 16/250,765, dated Mar. 29, 2019, 11 pages.
U.S. Notice of Allowance in U.S. Appl. No. 15/921,650 dated Apr. 4, 2019, 7 pages.
U.S. Non Final Office Action in U.S. Appl. No. 16/178,565, dated Apr. 4, 2019, 10 pages.
U.S. Final Office Action in U.S. Appl. No. 15/889,586 dated May 2, 2019, 19 pages.
U.S. Final Office Action in U.S. Appl. No. 15/941,731, dated May 3, 2019, 16 pages.
U.S. Final Office Action in U.S. Appl. No. 16/178,538 dated Jun. 7, 2019, 17 pages.
U.S. Notice of Allowance in U.S. Appl. No. 16/250,765, dated Jul. 10, 2019, 9 pages.
U.S. Final Office Action in U.S. Appl. No. 16/178,565, dated Jul. 12, 2019, 11 pages.
U.S. Notice of Allowance in U.S. Appl. No. 16/178,538 dated Jul. 17, 2019, 10 pages.
U.S. Notice of Allowance in U.S. Appl. No. 15/941,731, dated Jul. 17, 2019, 12 pages.
U.S. Non-Final Office Action in U.S. Appl. No. 15/889,586 dated Sep. 6, 2019, 17 pages.
International Search Report and Written Opinion as issued in connection with International Patent Application No. PCT/US2019/043933, dated Oct. 25, 2019, 9 pages.
U.S. Notice of Allowance in U.S. Appl. No. 16/178,565, dated Nov. 14, 2019, 5 pages.
U.S. Non Final Office Action in U.S. Appl. No. 15/945,722, dated Nov. 15, 2019, 13 pages.
International Search Report and Written Opinion as issued in connection with International Patent Application No. PCT/US2019/043932, dated Dec. 5, 2019, 16 pages.
International Search Report and Written Opinion as issued in connection with International Patent Application No. PCT/US2019/043988, dated Dec. 10, 2019, 13 pages.
U.S. Non Final Office Action in U.S. Appl. No. 16/250,157 dated Dec. 19, 2019, 6 pages.
U.S. Non-Final Office Action in U.S. Appl. No. 16/599,318, dated Jan. 16, 2020, 11 pages.
U.S. Non-Final Office Action in U.S. Appl. No. 16/722,085, dated Mar. 6, 2020, 5 pages.
U.S. Final Office Action in U.S. Appl. No. 15/889,586 dated Mar. 18, 2020, 18 pages.
U.S. Non-Final Office Action in U.S. Appl. No. 16/523,840, dated Mar. 19, 2020, 6 pages.
U.S. Notice of Allowance in U.S. Appl. No. 15/945,722, dated Apr. 3, 2020, 7 pages.
U.S. Notice of Allowance in U.S. Appl. No. 16/114,195, dated Apr. 3, 2019, 9 pages.
U.S. Non-Final Office Action in U.S. Appl. No. 16/736,971, dated Apr. 7, 2020, 14 pages.
U.S. Notice of Allowance in U.S. Appl. No. 16/250,157 dated Apr. 13, 2020, 8 pages.
U.S. Non-Final Office Action in U.S. Appl. No. 16/457,791 dated Apr. 15, 2020, 12 pages.
U.S. Final Office Action in U.S. Appl. No. 16/736,971, dated Apr. 17, 2020, 6 pages.
International Search Report and Written Opinion as issued in connection with International Patent Application No. PCT/US2020/016253, dated Apr. 29, 2020, 7 pages.
U.S. Advisory Action in U.S. Appl. No. 16/736,971, dated May 12, 2020, 5 pages.
U.S. Non-Final Office Action in U.S. Appl. No. 16/722,115, dated May 14, 2020, 6 pages.
U.S. Non-Final Office Action in U.S. Appl. No. 16/555,948, dated May 15, 2020, 8 pages.
International Search Report and Written Opinion as issued in connection with International Patent Application No. PCT/US2020/012641, dated May 28, 2020, 15 pages.
Extended European Search Report for Application No. 18848041.2 dated Jun. 23, 2020, 9 pages.
U.S. Final Office Action in U.S. Appl. No. 16/523,840, dated Jun. 26, 2020, 5 pages.
U.S. Notice of Allowance in U.S. Appl. No. 16/736,971, dated Jun. 30, 2020, 14 pages.
U.S. Advisory Action in U.S. Appl. No. 15/889,586 dated Jul. 10, 2020, 4 pages.
U.S. Notice of Allowance in U.S. Appl. No. 16/722,085, dated Jul. 16, 2020, 8 pages.
U.S. Final Office Action in U.S. Appl. No. 16/599,318, dated Jul. 23, 2020, 14 pages.
U.S. Notice of Allowance in U.S. Appl. No. 16/599,318, dated Aug. 4, 2020, 8 pages.
U.S. Non Final Office Action in U.S. Appl. No. 16/537,513, dated Sep. 3, 2020, 13 pages.
U.S. Non-Final Office Action in U.S. Appl. No. 15/889,586 dated Sep. 18, 2020, 19 pages.
U.S. Notice of Allowance in U.S. Appl. No. 16/523,840, dated Sep. 30, 2020, 11 pages.
U.S. Non Final Office Action in U.S. Appl. No. 16/903,374, dated Nov. 25, 2020, 16 pages.
U.S. Final Office Action in U.S. Appl. No. 16/722,115, dated Dec. 2, 2020, 7 pages.
U.S. Notice of Allowance in U.S. Appl. No. 16/523,840, dated Dec. 4, 2020, 11 pages.

* cited by examiner

TRANSFORMER RESONANT CONVERTER

BACKGROUND

Producing high voltage pulses with fast rise times is challenging. For instance, to achieve a fast rise time (e.g., less than about 50 ns) for a high voltage pulse (e.g., greater than about 10 kV), the slope of the pulse rise must be incredibly steep. Such a steep rise time is very difficult to produce. This is especially difficult using standard electrical components in a compact manner. It is additionally difficult to produce such a high voltage pulse with fast rise times having variable pulse widths and/or a variable high pulse repetition rate.

SUMMARY

Systems and methods are disclosed for producing high voltage, high frequency pulses using a switching voltage source and a transformer that includes a resonant converter such as, for example, a series resonant converter.

Some embodiments may include a resonant converter comprising a DC input, a plurality of solid state switches (which for us might be comprised of the SPA, a switching power amplifier based on the full bridge topology); a transformer having a stray inductance, $L_s$, a stray capacitance, $C_s$, and a primary to secondary turns ratio n; a total series resistance, R, that will be comprised of the stray series circuit resistance, $R_s$, and any additional series resistance, $R_a$, that is intentionally added to control Q; a diode rectifier on the secondary side of the transformer; and an output waveform filter. In some embodiments, the resonant circuit has a Q factor according to $$Q = \frac{1}{R}\sqrt{\frac{L_s}{C_s}};$$

and the resonant converter produces an output voltage $V_{out}$ from an input voltage $V_{in}$, according to $V_{out}=QnV_{in}$. In some embodiments, the stray inductance is measured from the primary side of the transformer and the stray capacitance is measured from the secondary side. In some embodiments, additional capacitance, $C_a$, and/or inductance, $L_a$, may be included to produce a desired resonant frequency and/or change the circuit Q.

Some embodiments may include a resonant converter circuit having a transformer having a stray inductance, $L_s$, and a stray capacitance, $C_s$; and a stray resistance with a resistance, $R_s$, in series with the transformer. In some embodiments, the resonant circuit produces a Q factor according to $$Q = \frac{1}{R}\sqrt{\frac{L}{C}},$$

where R is the sum of the series stray resistance $R_s$ and any additionally added resistance $R_a$ and equivalent series load resistance $R_L$, C is the sum of the stray capacitance $C_s$ and any added capacitance $C_a$ and any other stray capacitance $C_{so}$, and L is the sum of the stray series inductance $L_s$ and any additional added inductance $L_a$ and any other stray series inductance $L_{so}$.

In some embodiments, the output can have a voltage greater than 5 kV, 15 kV, and/or 50 kV.

In some embodiments, the resonant converter can operate with a frequency greater than about 25 kHz or 100 kHz.

In some embodiments, the ratio between a peak output power and an average output power is greater than a factor of 10.

In some embodiments, the stray inductance $L_s$ comprises more than 50% of the total circuit inductance.

In some embodiments, the output pulses have a rise time with a voltage slew rate greater than $10^9$ V/s.

In some embodiments, the resonant converter includes an output that is galvanically isolated from its input (e.g., a floating output).

In some embodiments, the pulse output voltage can be adjusted during the pulse duration with a timescale of less than 10 µs to make the adjustment to a new voltage output level.

In some embodiments, the stray capacitance $C_s$ comprises more than 50% of the total circuit resonant capacitance.

In some embodiments, the peak output power is greater than 5 kW or greater than 50 kW.

The embodiments described in this document, whether in the summary or elsewhere, are mentioned not to limit or define the disclosure, but to provide examples to aid understanding thereof. Additional embodiments are discussed in the Detailed Description, and further description is provided there. Advantages offered by one or more of the various embodiments may be further understood by examining this specification or by practicing one or more embodiments presented.

DETAILED DESCRIPTION

Systems and methods are disclosed for producing high voltage, high frequency pulses using a switching voltage source and a transformer, arranged with other components, to be a series resonant converter, or a transformer resonant converter. The switching voltage source, for example, may include a full bridge or a half bridge topology. For example, the switching voltage source may include a full bridge or a half bridge switch topology. As another example, the switching voltage source may have additional output filter elements. The switching voltage source, for example, may include a full bridge topology or a half bridge topology. In some embodiments, the switching voltage source may include a switching power amplifier.

The transformer resonant converter, for example, may not include any physical capacitors and/or inductors. Instead, in some embodiments, the transformer resonant converter may include a resistor in series with the stray capacitance and/or the stray inductance of at least the transformer. The stray inductance, $L_{so}$, and/or stray capacitance, $C_{so}$, of other circuit elements may also be leveraged as part of the resonant converter. In some embodiments, the total stray inductance and/or the stray capacitance can be small. For example, the stray inductance can be less than about 3,000 nH, 300 nH, 30 nH, 3 nH etc., as measured on the primary side of the transformer. As another example, the stray capacitance can be less than about 300 pF or less than about 30 pF, as measured on the secondary side of the transformer. Additional capacitance, $C_a$, and inductance, $L_a$, may be added in conjunction such as, for example, in parallel and/or series with the stray capacitance and stray inductance.

Figure 6:
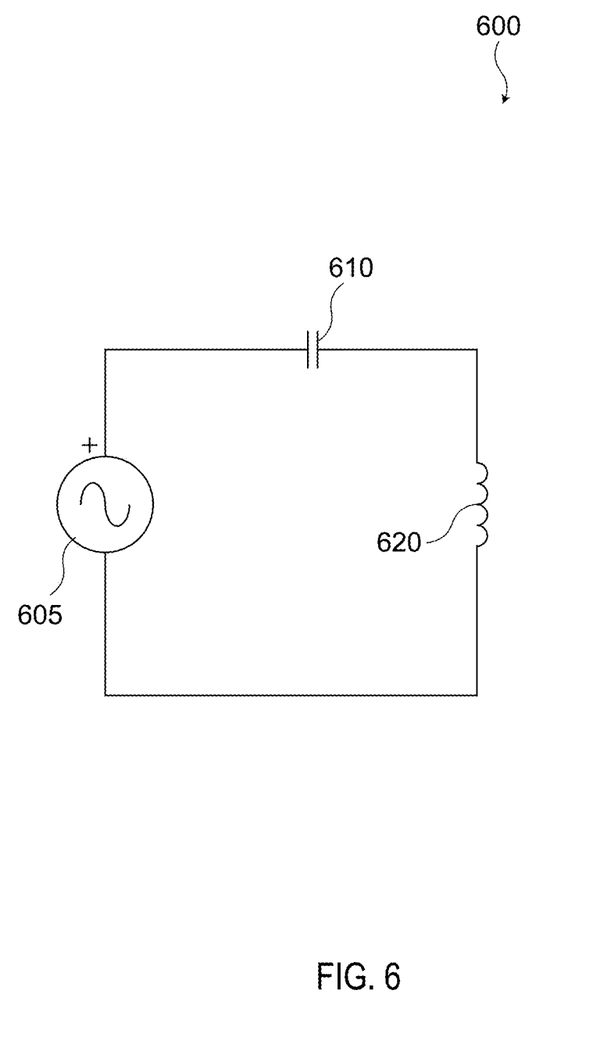
FIG. 6 is an idealized example of a series resonant circuit according to some embodiments.

Resonant converters typically leverage the resonance of a circuit when the circuit is driven at the resonant frequency (an example series resonant circuit is shown in FIG. 6). The resonant frequency can be determined from the total inductance and capacitance of the circuit elements, for example, from the following:

$$f = \frac{1}{2\pi\sqrt{LC}} \quad (1)$$

in this example, L and C represent the total effective and/or equivalent series circuit inductance and capacitance, respectively, and as defined above, $L=L_s+L_{so}+L_a$, and $C=Cs+C_{so}+C_a$. FIG. 6 shows an idealized series resonant circuit 600 without any resistance; and with an inductor 620, a capacitor 610, and power source 605. Resistance may be present in various forms throughout the circuit.

When a resonant circuit is driven at its resonant frequency the effective reactance of each of the circuit components are equal in magnitude but opposite in sign. Therefore, they cancel each other out and all that's left is the real resistance of the circuit whether composed of stray resistance and/or resistive elements, including the load. In some cases, this real resistance can be the resistance of the copper traces and/or any other circuit components in series with the resonant LC components. The ratio of the reactive components to the real resistance is defined as the Q factor, which is a dimensionless parameter that is a good estimate for what multiplier the driving voltage will ring up to when measured across either L or C. The resonant frequency and Q factor can be calculated from the following:

$$Q = \frac{1}{R}\sqrt{\frac{L}{C}}. \quad (2)$$

R is the total equivalent series/dissipative resistance and may include any series stray resistance Rs as well as any additionally added resistance Ra, and additional equivalent series load resistance $R_L$, as well as any other dielectric or other dissipative losses from switches or other components. Typical resonant converters use discrete physical circuit components for the inductor, capacitor, and/or a resistor to create a desired Q factor and resonant frequency f. In some embodiments, additional resistance may be left out to improve circuit efficiency. In some embodiments, some form of feedback and control may be used to regulate the output voltage to a value lower than that which would naturally be set by the circuit Q. One such form of feedback and control, for example, may rely on pulse width modulation of the switching voltage source.

Figure 1:
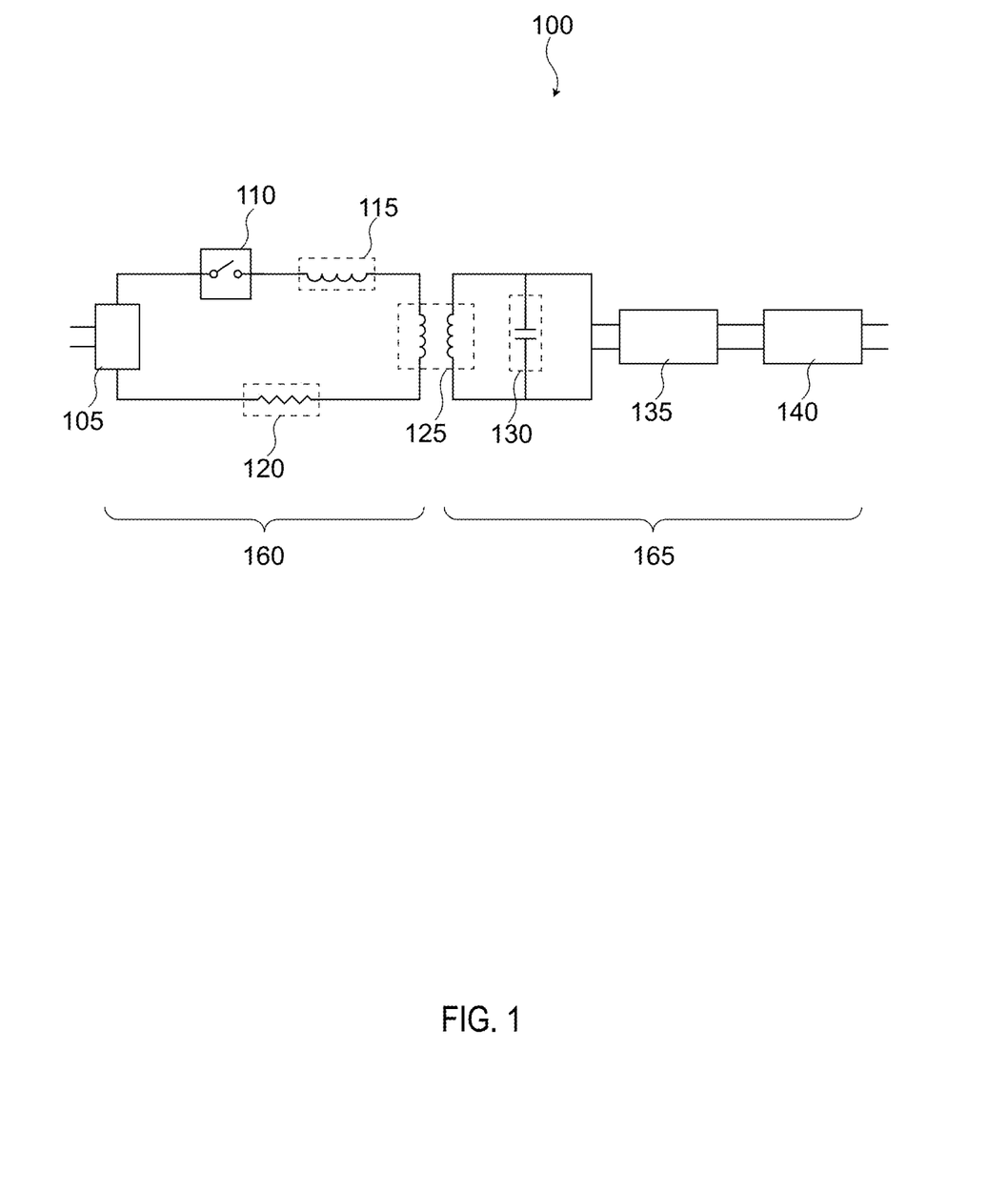
FIG. 1 is an example transformer resonant converter according to some embodiments.

FIG. 1 is a circuit diagram of an example transformer resonant converter 100 according to some embodiments. On the primary side 160 of the transformer, the resonant converter 100 may include, for example, a DC input 105 coupled with a switch 110. In some embodiments, the switch may include a freewheeling diode or a body diode. The switch 110 may open and close at high frequencies, such as, for example, at the resonant frequency of the transformer resonant converter 100.

The switch 110, for example, may be any type of solid-state switch. The primary side 160 of the resonant converter may also include resonant series inductance 115 and resonant series resistance 120. The switch 110, for example, can produce high frequency pulses such as at frequencies greater than 50 KHz, 500 kHz, 5000 KHz, for example.

In some embodiments, the switch 110 may operate with transition times less than, for example, about 40 ns, 10 ns, or 1 ns.

In some embodiments, the switch 110 may include a solid-state switch. The switch 100, for example, may include an IGBT switch, MOSFET switch, FET switch, GaN switch, etc. In some embodiments, the switch 110 may be a high efficiency switch. In some embodiments, the switch 110 may be a fast switch (e.g., switching with a frequency greater than 100 kHz), which may allow for an output with low ripple. In some embodiments, pulse width modulation (PWM) techniques can be utilized for fast control of the output voltage, to allow, for example, the control of beam characteristics with tens of µs resolution, for example, when driving neutral beams.

The resonant series inductance 115 may include, for example, stray inductance of the transformer, stray inductance of the primary side 160 circuitry, and/or a physical inductor. The resonant series inductance 115 may be small, for example, less than about 3,000 nH, 300 nH, 30 nH, 3 nH, etc.

The resonant series resistance 120 may include stray resistance and/or a physical resistor. In some embodiments, a physical resistor may lower circuit efficiency, however, a physical resistor may allow for faster circuit response times, and/or may reduce the need for feedback and control loops to control/regulate the output voltage.

The transformer 125 may include any type of transformer such as, for example, a toroid shaped transformer with one or more primary side windings and a plurality of secondary side windings. As another example, the transformer 125 may be a coaxial transformer with one or more primary side windings and a plurality of secondary side windings. In some embodiments, the one or more primary side windings may include a conductive sheet. In some embodiments, the one or more secondary windings may include a conductive sheet.

The circuitry on the secondary side of the transformer 125 may include resonant series capacitance 130. The resonant series capacitance 125, for example, may include stray capacitance of the transformer and/or stray capacitance of the secondary side circuitry and/or a capacitor. The resonant series capacitance 125 may be small, for example, less than about 1,000 pF, 100 pF, 10 pF, etc. The resonant series capacitance 125 may be in parallel with the transformer output. The secondary side 165 of the circuit may include a rectifier 135 and/or an output filter 140.

In some embodiments, a primary winding and/or a secondary winding may include single conductive sheet that is wrapped around at least a portion of a transformer core. A conductive sheet may wrap around the outside, top, and inside surfaces of a transformer core. Conductive traces and/or planes on and/or within the circuit board may complete the primary turn, and/or connect the primary turn to other circuit elements. In some embodiments, the conductive sheet may comprise a metal sheet. In some embodiments, the conductive sheet may comprise sections of pipe, tube, and/or other thin walled metal objects that have a certain geometry.

In some embodiments, a conductive sheet may terminate on one or more pads on a circuit board. In some embodiments, a conductive sheet may terminate with two or more wires.

In some embodiments, a primary winding may include a conductive paint that has been painted on one or more outside surfaces of the transformer core. In some embodiments, the conductive sheet may include a metallic layer that has been deposited on the transformer core using a deposition technique such as thermal spray coating, vapor deposition, chemical vapor deposition, ion beam deposition, plasma and thermal spray deposition, etc. In some embodiments, the conductive sheet may comprise a conductive tape material that is wrapped around the transformer core. In some embodiments, the conductive sheet may comprise a conductor that has been electroplated on the transformer core. In some embodiments, a plurality of wires in parallel can be used in place of the conductive sheet.

In some embodiments, an insulator may be disposed or deposited between transformer core and the conductive sheet. The insulator, for example, may include a polymer, a polyimide, epoxy, etc.

Figure 7:
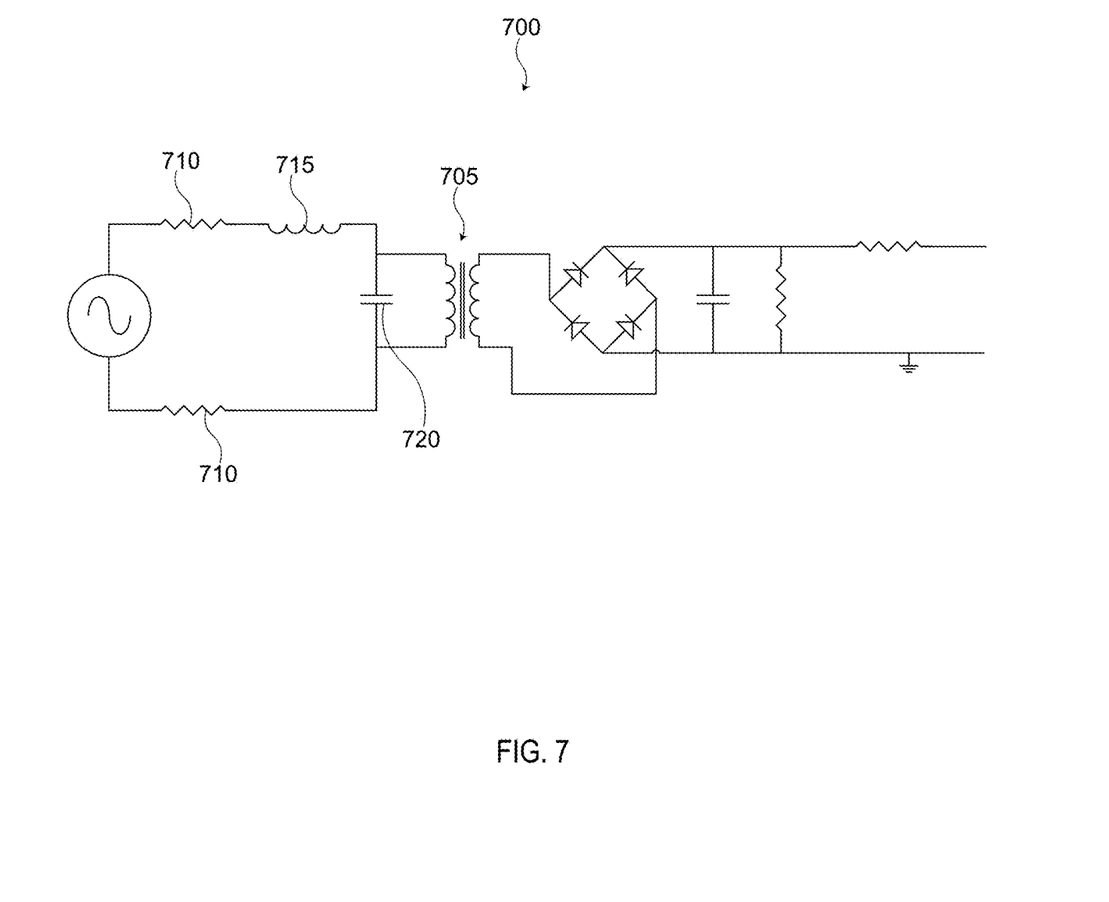
FIG. 7 is a circuit diagram of an example transformer resonant converter according to some embodiments.

The rectifier 135 may include any type of rectifier such as, for example, a diode-based rectifier, a full-bridge rectifier (e.g., as shown in FIG. 7), a half-bridge rectifier, a three-phase rectifier, a voltage multiplying rectifier, etc. Any other type of rectifier can be used.

The output filter 140 may include any type of filter. For example, the output filter 140 may include a high pass filter, a low pass filter, a band pass filter, etc.

Some embodiments may include a transformer resonant converter 100 that has low stray inductance measured from the primary side 160. Low stray inductance may include inductance less than, for example, about 3,000 nH, 300 nH, 30 nH, 3 nH, etc.

Some embodiments may include a transformer resonant converter 100 that has low stray capacitance as measured from the primary side 160. Low stray capacitance may include capacitance less than, for example, about 1,000 pF, 100 pF, 10 pF, etc.

Some embodiments may include the transformer resonant converter 100 that can produce high average output power such as greater than, for example, about 3 kW, 100 kW, 3 MW. For short bursts the peak power output, for example, may exceed 30 kW, 300 kW, 3 MW. Some embodiments may include a transformer resonant converter 100 that produces pulses with high voltage such as greater than, for example, 5 kV, 25 kV, 250 kV, 2500 kV. Some embodiments may include a transformer resonant converter 100 that produces a high power burst operation with a peak power greater than 5 times the average operating power of the converter. In some embodiments, the peak power output may be in excess of the average output power by a factor, for example, of 5, 50, 500.

In some embodiments, the transformer resonant converter 100 can produce high voltage pulses with a fast rise time, for example, less than, for example, about 10 µs, 1 µs, 100 ns, 10 ns, etc. for voltages greater than for example 5 kV, 30 kV, 100 kV, 500 kV, etc.

In some embodiments, the transformer resonant converter 100 can produce an output pulse with low voltage ripple such as, for example, less than about 5%. Typical output voltage ripple may be less than, for example, 15% or 0.5%.

In some embodiments, the transformer resonant converter 100 can operate with pulse width modulation that may allow for greater control of the output waveform and/or allow for high efficiency power output. In some embodiments, the transformer resonant converter may include real time feedback and control of the high voltage and/or power output. In some embodiments, the low stray inductance and/or low stray capacitance, and/or high frequency of operation can allow for this feedback loop to be fast.

In some embodiments, the transformer resonant converter 100 may significantly increase the overall power density of a system. For example, the transformer resonant converter 100 could be used with an electron tube driver for high-power radar systems and/or RF systems. In some embodiments, the transformer resonant converter 100 may increase the overall power density of the high-power radar systems and/or the RF systems. Power densities may exceed, for example, 0.5 W/cm$^3$, 5 W/cm$^3$, 50 W/cm$^3$, or 500 W/cm$^3$.

In some embodiments, the transformer resonant converter 100 may include switching components that are at low voltage in a standard H-bridge power supply configuration with a hard ground reference. This may, for example, remove the requirement of floating each module to high voltage as seen in the pulse step modulator.

In some embodiments, a transformer resonant converter may include high voltage components that include a high voltage transformer and rectification diodes and other high voltage components. These components can, for example, be packaged for safe high voltage using oil, potting or other methods. In some embodiments, some components may be in air with appropriate stand-off to eliminate corona generation, arcing, and/or tracking.

In some embodiments of the transformer resonant converter, the output is transformer isolated, so the same system can provide either a floating or ground referenced output and/or can be configured to provide either a positive or negative polarity. This may allow, for example, the same design to be utilized for any of the various high voltage grids of a particular neutral beam injection design including, for example, either positive or negative ion extraction and acceleration as well as ion and electron suppressor grids.

In some embodiments, a resonant converter may produce the same power levels with a dramatic decrease in overall system size and/or control complexity as compared to the pulse step modulators used currently for smaller neutral beam injector systems.

In some embodiments, the resonant converter may be safe to arc-faults due the inherent series resonant behavior of the supply. The series resonant behavior of a resonant converter may have a supply impedance that is matched to the load. When an arc occurs, for example, this mismatch can reduce the power flowing in the primary side 160 of the circuit and the voltage on the secondary may fall, whereby the current in the arc cannot continue to increase to the point of damage to the grids.

In some embodiments, the transformer resonant converter may have very little energy stored in its output filter components. For example, this stored energy may be less than, for example, about 10 J, 1.0 J, or 0.1 J. The high frequency of operation allows this stored energy to be minimized. In some embodiments, minimizing this stored energy can be important. This energy, for example, can damage load components when arcs occur.

In some embodiments, a transformer resonant converter may be modular. In some embodiments, a transformer resonant converter may be easily scaled to higher output power levels making it a possible choice for large neutral beam injector systems such as, for example, like those used at NSTX, DIII-D, or ITER. For example, power supplies with a transformer resonant converter can be added together with output arranged in series to easily increase the output voltage. Similarly, output current can be increased by adding units in parallel on the primary as long as the high voltage side is scaled to account for the increase current level.

Figure 2:
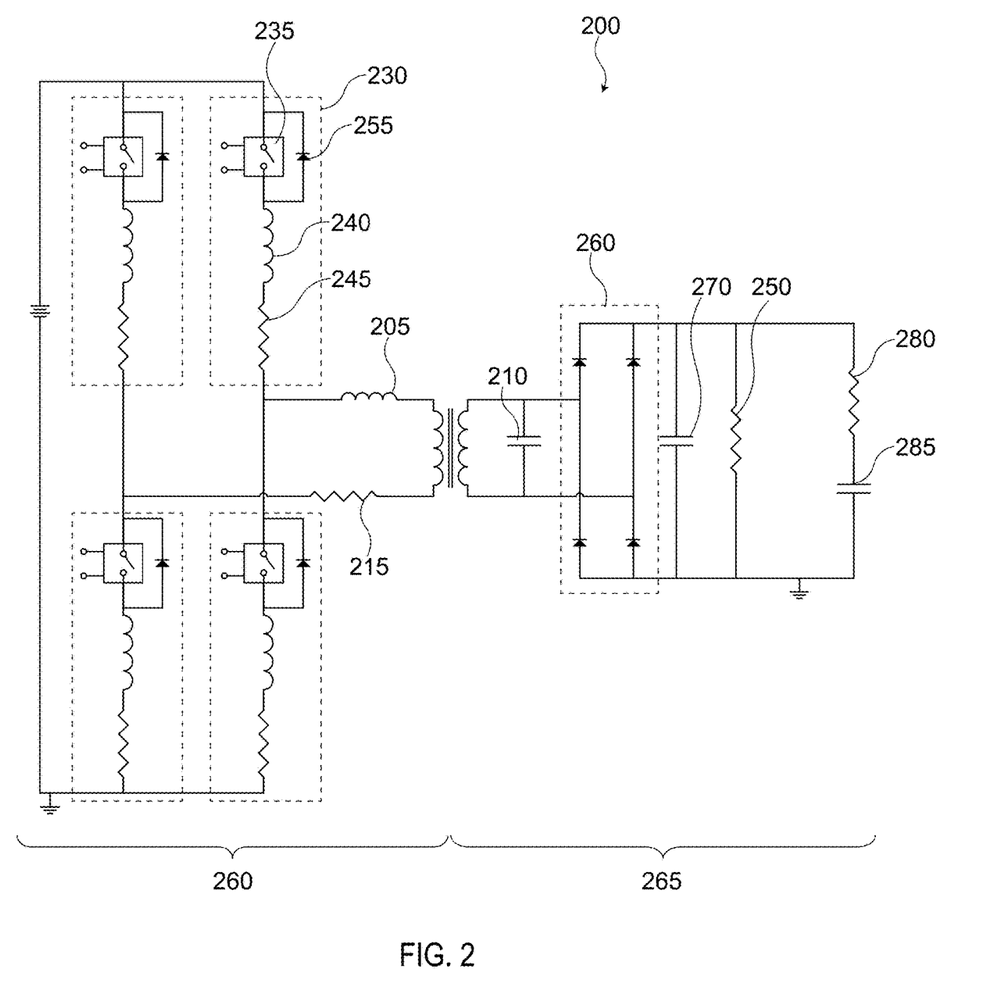
FIG. 2 is a circuit diagram of an example transformer resonant converter coupled with switching circuitry and a load according to some embodiments.

FIG. 2 is a circuit diagram of a transformer resonant converter 200 coupled with a load 250 according to some embodiments. The transformer 225, for example, can have any number of turns. For example, the transformer can have a turn ratio of n=1, n=30, n=50, n=100, etc. The total series inductance is represented by an inductor circuit element 205 (e.g., having an inductance less than about 3,000 nH, 300 nH, 30 nH, 3 nH) on the primary side 260, which may be primarily composed of the stray inductance $L_s$ of the transformer. The total series capacitance is represented by a capacitor circuit element 210 (e.g., having a capacitance less than about 1,000 pF, 100 pF, 10 pF, etc.) on the secondary side 265, which may be primarily composed of the stray capacitance $C_s$ of the transformer. The stray inductance 205 and/or the stray capacitance 210 can be of any value depending on the size, type, material, etc. of the transformer and/or the number of turns of the transformer. In this circuit, a primary resistor 215 may be included in the circuit in series with the inductor 205 and/or the capacitor 210. In some embodiments, the primary resistor 215 may have a small value, such as, for example, less than 3,000 mOhms, 300 mOhms, 30 mOhms, 3 mOhms.

In this example, the transformer resonant converter 200 includes switching circuitry with four switch circuits 230. However, any number of switch circuits can be used. Each switch circuit 230 may include a solid-state switch 235 with any number of circuit elements. The solid-state switch may include, for example, an IGBT switch, MOSFET switch, FET switch, GaN switch, etc. Each switch circuit 230 may also include stray inductance represented by circuit element 240 and/or stray resistance represented by circuit element 245. Each switch circuit 230 may also include a diode 255.

In this example, the secondary side of the transfer may also include a full bridge rectifier 260, an output filter 270, a load element 250 (e.g., in a specific example, comprising an 86 k Ohm resistor), and/or a filter resistor 280 (e.g., in a specific example, comprising a 10 k Ohm resistor) that acts in conjunction with an external user load capacitor 285 (e.g., in a specific example, comprising a capacitor of 30 pF). In the circuit shown, for example, no feedback and control regulation may be required.

Any number of circuit elements combined in any configuration may follow the rectifier. For example, these other elements may include capacitive, inductive, and/or resistive filter components, and/or the external loads.

In some embodiments, a transformer resonant converter (e.g., transformer resonant converter 100, transformer resonant converter 200, transformer resonant converter 700, etc.) can produce pulses with various properties. For example, a transformer resonant converter can produce pulses with a voltage greater than about 30 kV. For example, a transformer resonant converter can produce pulses with a voltage greater than about 5 kV, 25 kV, 250 kV, or 2,500 kV. For example, a transformer resonant converter can produce pulses with a rise time to or a fall time from voltages greater than about 25 kV of less than about 300 µs, 30 µs, 3 µs. For example, a transformer resonant converter can produce pulses with a variable pulse width. For example, a transformer resonant converter can produce pulses with a variable frequency. For example, a transformer resonant converter can produce pulses with a variable voltage. For example, a transformer resonant converter can produce pulses for a dielectric barrier discharge and/or neutral beam injection devices. For example, a transformer resonant converter can produce pulses that have a pulse width of any duration such as, for example, ranging from about 1 µs to DC.

For example, a transformer resonant converter can produce pulses with a pulse repetition rate greater than about 1 kHz for continuous operation at average power levels in excess of several kilowatts. For example, a transformer resonant converter can produce pulses having a pulse repetition frequency greater than about 1 kHz, 30 kHz, or 1000 kHz. For example, a transformer resonant converter can produce pulses having power greater than about 3 kW, 100 kW, or 3 MW.

In some embodiments, a transformer resonant converter can be housed in a rack-mountable enclosure (e.g., standard 6U enclosure that is has approximate dimensions of 10"×17"×28"). In some embodiments, a transformer resonant converter may have a high power density, for example, a power density that can exceed 0.5 W/cm$^3$, 5 W/cm$^3$, 50 W/cm$^3$ or 500 W/cm$^3$.

In some embodiments, a transformer resonant converter may include any type of solid state switches such as, for example, an IGBT, an FET, a MOSFET, a SiC junction transistor, a GaN switch, etc.

Figure 3:
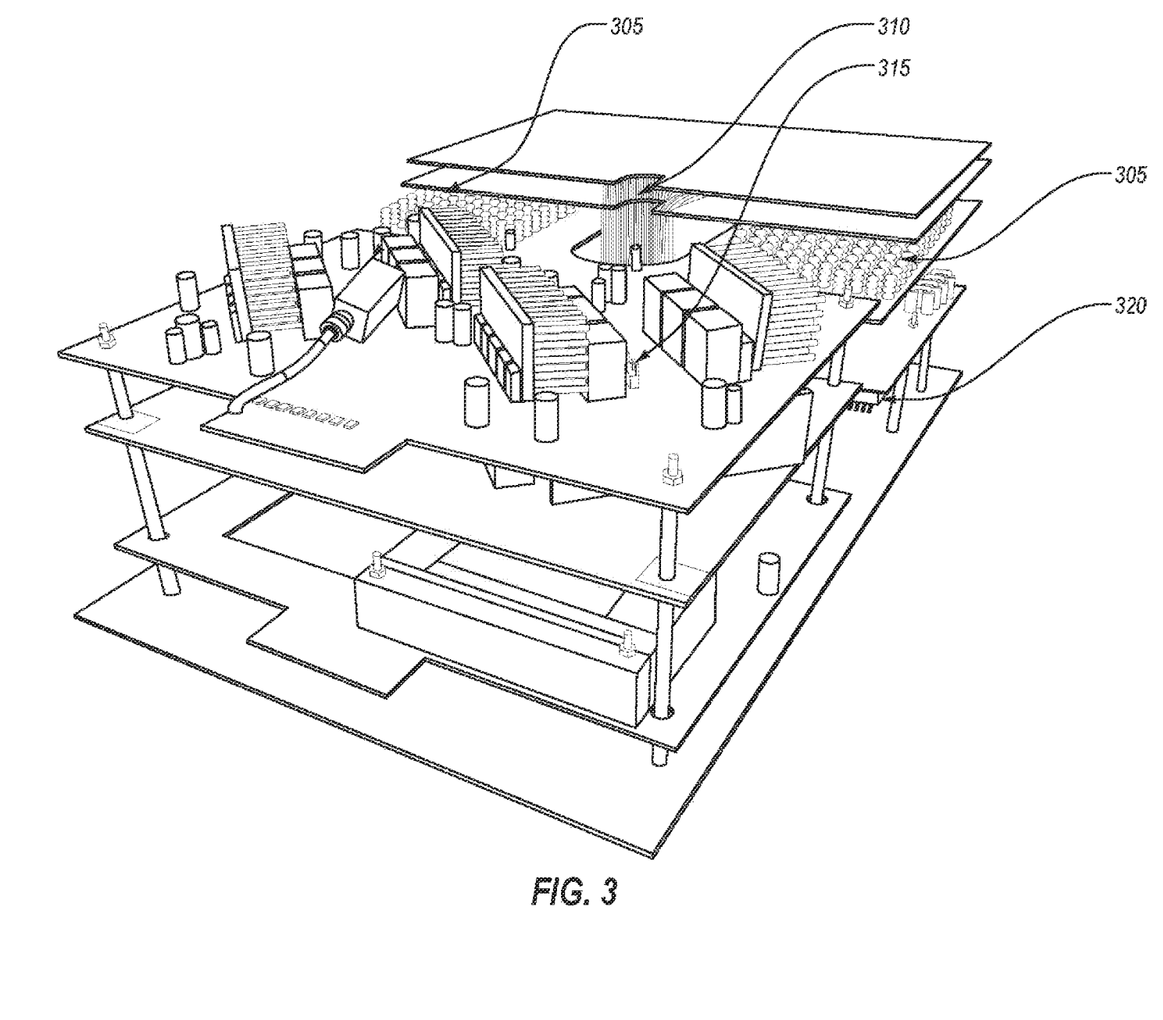
FIG. 3 is a photograph of an example resonant converter.

FIG. 3 is a photograph of an example transformer resonant converter including a transformer with windings 310 and a plurality of resistors 305. The value of the cumulative resistance of the plurality of resistors 305 can be determined from equation 2 for a give Q factor. The transformer resonant converter also includes a plurality of solid state switches 315 that are coupled with heat sinks. The solid-state switches can be arranged, for example, in the full bridge topology in this instance. The transformer resonant converter also includes a plurality of full-bridge rectifying diodes 320. Numerous other circuit elements can also be included.

Figure 4:
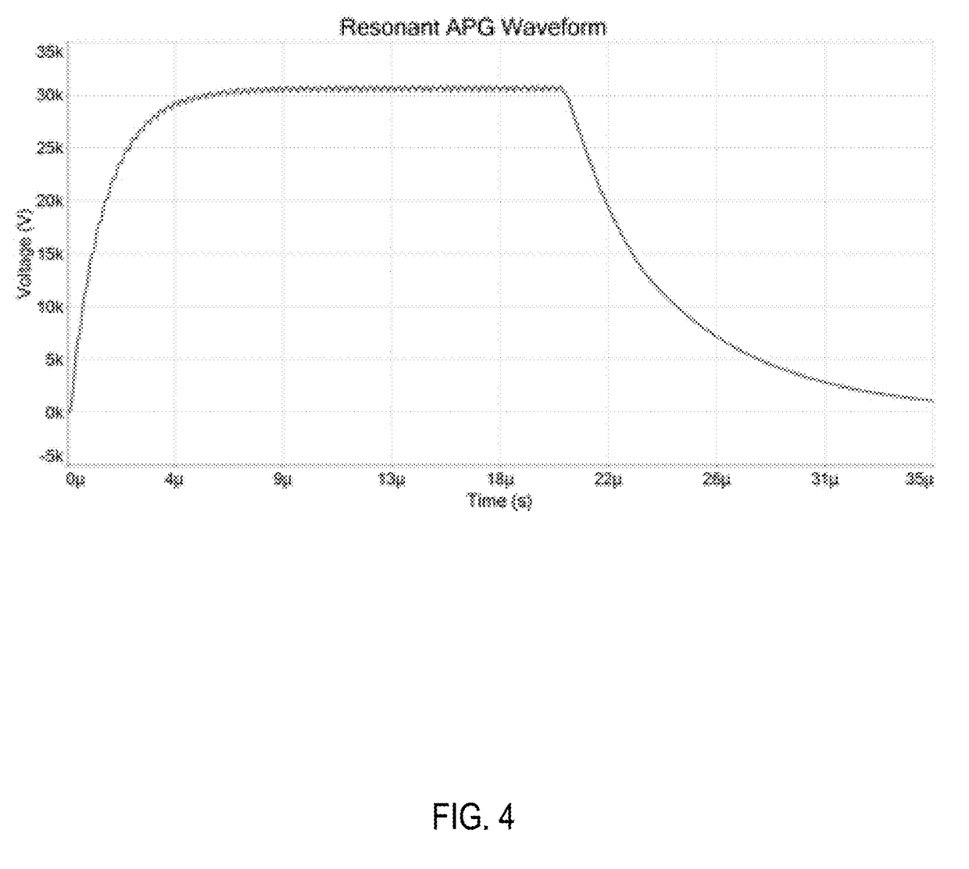
FIG. 4 is an example waveform created from a transformer resonant converter according to some embodiments.

FIG. 4 is an example waveform created from a transformer resonant converter according to some embodiments. In this example, the output voltage is greater than 30 kV, has a rise time of about 4 µs and a flat top width of about 12 µs.

Figure 5:
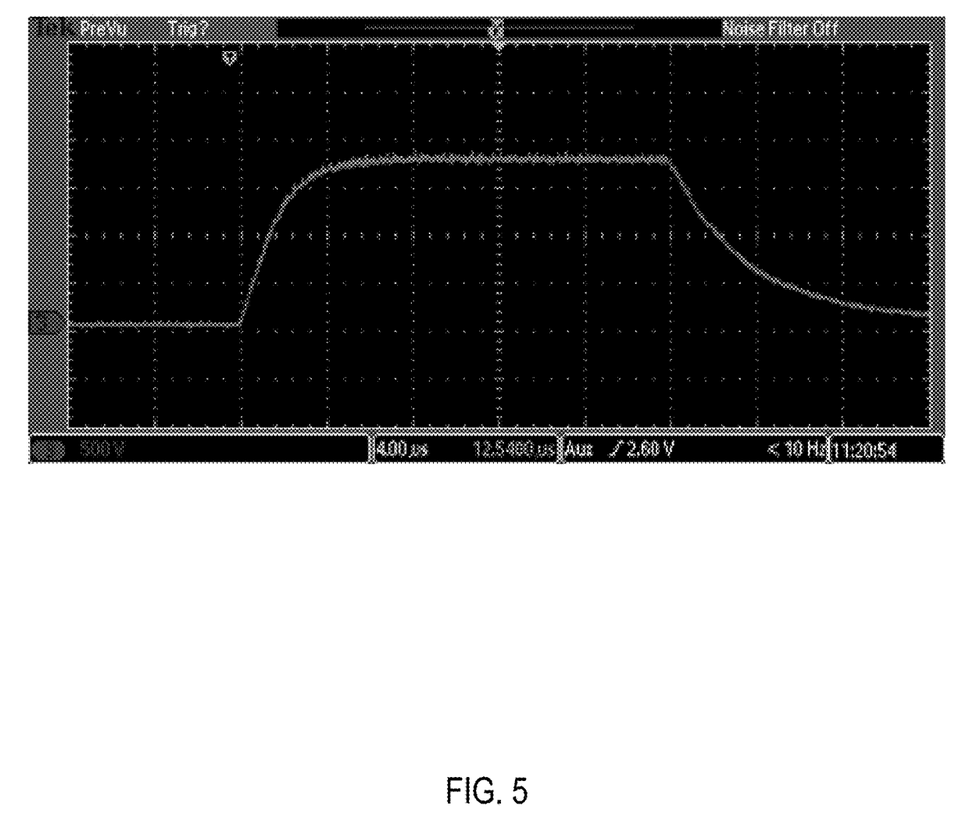
FIG. 5 is an example waveform created from a transformer resonant converter according to some embodiments.

FIG. 5 is another example waveform created from a transformer resonant converter according to some embodiments. This waveform was produced by the switching resonant converter shown in FIG. 2. In this example, the input voltage to the transformer resonant converter was 600 V and the output pulse is 30 kV. In this example, the rise time is about 5 µs and the flat top width is about 20 µs. These waveforms could have additional rises, flat tops, and falls, depending on the modulation of the resonant converter. This waveform shows one typical output pulse; various other output pulses are possible. In some embodiments, the high power density, power, frequency, rise time, and/or voltage of the output of a transformer resonant converter can be unique. These attributes, for example, may be enabled by the use of a transformer (and/or circuit) with low stray capacitance and/or low stray inductance that allows for operation at high frequency, and the use of solid state switches that operate at high power with very fast transition times.

FIG. 7 is a circuit diagram of an example transformer resonant converter 700 according to some embodiments. In this example, a transformer 705 is coupled with and/or is part of a resonant converter topology where the transformer 705 has a step-up voltage of n, which represents the ratio of turns of the primary winding to the turns of the secondary winding of the transformer 705. In this transformer, the stray inductance $L_s$ is represented by inductor 715, and/or the stray capacitance $C_s$ is represented by capacitor 720 of the transformer. These stray elements are leveraged as part of the resonant converter 700. The stray inductance $L_{so}$ and stray capacitance $c_{so}$ of other circuit elements can also be leveraged be used in conjunction with stray inductance $L_s$ 715 and capacitance $C_s$ 720 to achieve the desired resonant frequency f, and Q. Resistor 710 represents the additional resistance $R_a$ that may be included on the primary side of the transformer. Once the stray inductance $L_s$ and the stray capacitance $C_s$ of the transformer are known, and the total inductance and capacitance are known, even if they are only comprised of stray elements, the resistance, for example, $R_{pri}$, can be selected to produce a given Q factor using, for example, equation (2). In this example, the voltage on the secondary of the transformer can be calculated from the following:

$$V_{out} = QnV_c \qquad (3).$$

Thus, the voltage on the secondary of the transformer can be stepped up by the transformer by a factor of n multiplied by the resonant converter by a factor of Q.

In some transformer resonant converters, the total stray inductance and the total stray capacitance, of the transformer and/or other circuit elements are kept low, for example, to produce a resonant oscillating voltage at high frequency, and an output voltage with fast rise times and/or fast fall rise times. For example, the circuit can switch at high frequencies such as, for example, at frequencies greater than 50 kHz, 500 kHz, 5 MHz, for example. The low total stray inductance and the low total stray capacitance of the transformer and/or other circuit elements may also, for example, be kept low to produce fast rectified rise times, faster than 100 µs, 10 µs, 1 µs, for example.

In some embodiments, the stray capacitance can be measured from the secondary side of the transformer. Alternatively, the stray capacitance can be measured from the primary side of the transformer, which is equal to the capacitance on the secondary side of the transformer times the square of the turns ratio n.

In some embodiments, the stray inductance can be measured from the primary side of the transformer. Alternatively, the stray inductance can be measured from the secondary side of the transformer, which is equal to the inductance on the primary side of the transformer times the square of the turns ratio n.

In some embodiments, the total equivalent series capacitance can be measured from the secondary side of the transformer. Alternatively, the total equivalent series capacitance can be measured from the primary side of the transformer, which is equal to the total equivalent series capacitance on the secondary side of the transformer times the square of the turns ratio n.

In some embodiments, the total equivalent series inductance can be measured from the primary side of the transformer. Alternatively, the total equivalent series inductance can be measured from the secondary side of the transformer, which is equal to the total equivalent series inductance on the primary side of the transformer times the square of the turns ratio n.

Figure 8:
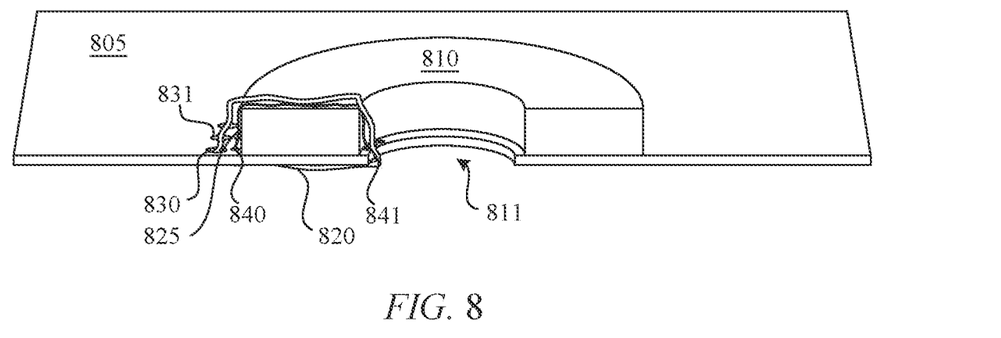
FIG. 8 illustrates a cutaway side view of a transformer with a primary winding and a secondary winding wrapped around a transformer core.

FIG. 8 illustrates a cutaway side view of a transformer 810 with a primary winding 825 and a secondary winding 820 wrapped around a transformer core 810 according to some embodiments. While only a single primary winding 825 and a single secondary winding 820 are shown, any number of windings may be used. This image only shows a single primary winding 825 and a single secondary winding 820 in order to show how the windings are uniquely wound around the transformer core 810.

In some embodiments, the primary windings may be disposed close to the core to reduce stray inductance. In some embodiments, the secondary windings may be spaced some distance away from the core to reduce stray capacitance.

As shown the primary winding 825 terminates at pad 840 on the outer perimeter of the transformer core 810 and at pad 841 within the central hole of the toroid shaped transformer core 810. In some embodiments, the pad 841 may be coupled with a conductive circuit board trace on an internal layer of the circuit board 805. The pad 840 and the pad 841 electrically couple the primary winding with the primary circuitry including, for example, a switch circuit (e.g., switch circuit 105) and/or other components.

As shown, the secondary winding 820 is wrapped around the transformer core 810 by passing through hole 830 in the circuit board 805 located at the perimeter of the toroid shaped transformer core 810, the internal hole of the toroid shaped transformer core 810, and the hole 811 in the circuit board 805. Successive windings of the secondary winding 820 may pass through hole 830 or another hole 831 in the circuit board. Additionally, successive windings of the secondary winding 820 may pass through hole 811 in the circuit board 805. The secondary winding 820 may be coupled with a secondary circuity such as, for example, a compression circuit, output components, and/or a load. In some embodiments, a single secondary winding 820 may be wrapped around the transformer core 810 a plurality of times passing through a plurality of holes located on the perimeter of the transformer core 810 and the hole 811.

The term "substantially" means within 5% to 15% of the value referred to, or within manufacturing tolerances.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for-purposes of example rather than limitation, and does not preclude inclusion of such That which is claimed:

1. A resonant converter circuit comprising:
   a DC input providing an input voltage $V_{in}$;
   a plurality of solid state switches electrically coupled with the DC input;
   a transformer comprising:
      a transformer core,
      a primary side comprising a conductive sheet wrapped at least around a portion of the transformer core, the conductive sheet electrically coupled with the plurality of solid state switches;
      a secondary side comprising a plurality of secondary windings wrapped at least around a portion of the transformer core,
      a stray inductance, $L_s$,
      a stray capacitance, $C_s$, and
      a turn ratio, n;
   a resistor with a resistance, R, disposed in series between the conductive sheet of the transformer and the plurality of solid state switches;
   a plurality of rectifier diodes coupled with the plurality of secondary windings; and
   a circuit output coupled with the plurality of rectifier diodes;
   wherein the resonant converter circuit produces a Q factor according to $$Q = \frac{1}{R}\sqrt{\frac{L_s}{C_s}};$$

and
   wherein the resonant converter circuit produces output pulses at the circuit output with an output voltage $V_{out}$ from the input voltage $V_{in}$, according to $V_{out}=QnV_{in}$.

2. The resonant converter circuit according to claim 1, wherein the output pulses have a voltage greater than about 10 kV.

3. The resonant converter circuit according to claim 1, wherein the output pulses have a frequency greater than 25 kHz.

4. The resonant converter circuit according to claim 1, wherein a resonant frequency is greater than 100 kHz.

5. The resonant converter circuit according to claim 1, wherein the output pulses have an output power greater than 5 kW.

6. The resonant converter circuit according to claim 1, wherein the output pulses have an output power greater than 50 kW.

7. The resonant converter circuit according to claim 1, wherein the resonant converter circuit has a switching transition time less than 40 ns.

8. The resonant converter circuit according to claim 1, wherein the resonant converter circuit has a total circuit inductance less than about 300 nH as measured on a primary side of the transformer.

9. The resonant converter circuit according to claim 1, wherein the resonant converter circuit operates with a total circuit capacitance of less than about 100 pF as measured on a secondary side of the transformer.

10. The resonant converter circuit according to claim 1, wherein the output pulses have a rise time, with a voltage slew rate greater than $10^9$ V/s.

11. The resonant converter circuit according to claim 1, wherein the resonant converter circuit has a power density greater than 1 W/cm$^3$.

12. The resonant converter circuit according to claim 1, wherein the stray capacitance $C_s$ comprises more than 50% of a total circuit resonant capacitance C.

13. A resonant converter circuit comprising:
   a transformer having:
      a transformer core;
      a conductive sheet wrapped at least around a portion of the transformer core;
      a plurality of secondary windings wrapped at least around a portion of the transformer core;
      a stray inductance, $L_s$, wherein the stray inductance, $L_s$, is not from an inductor;
      a stray capacitance, $C_s$, wherein the stray capacitance, $C_s$, is not from a capacitor; and
      a resistor with a resistance, R, in series with the transformer;
   wherein the resonant converter circuit produces a Q factor according to $$Q = \frac{1}{R}\sqrt{\frac{L_s}{C_s}}.$$

14. The resonant converter circuit according to claim 13, wherein the transformer has a turn ratio n and the resonant converter circuit produces an output voltage, $V_{out}$, from an input voltage $V_{in}$, according to $V_{out}=QnV_{in}$.

15. The resonant converter circuit according to claim 13, wherein the resonant converter circuit produces a pulse with a voltage greater than about 10 kV.

16. The resonant converter circuit according to claim 13, wherein the resonant converter circuit operates at a resonant frequency greater than 0.1 MHz.

17. The resonant converter circuit according to claim 13, wherein the resonant converter circuit produces pulses with a switching transition time less than 40 ns.

18. The resonant converter circuit according to claim 13, wherein the resonant converter circuit has a total circuit inductance less than about 300 nH as measured on a primary side of the transformer.

19. The resonant converter circuit according to claim 13, wherein the resonant converter circuit operates with a total circuit capacitance less than about 100 pF as measured on a secondary side of the transformer.

20. The resonant converter circuit according to claim 13, wherein the output pulses have a rise time, with a voltage slew rate greater than $10^9$ V/s.

21. The resonant converter circuit according to claim 13, wherein the resonant converter circuit produces output pulses with a power density greater than 1 W/cm$^3$.

22. The resonant converter circuit according to claim 13, wherein the resonant converter circuit does not include an inductor.

23. The resonant converter circuit according to claim 13, wherein the resonant converter circuit does not include a capacitor.

24. The resonant converter circuit according to claim 13, wherein a ratio between a peak output power and an average output power is greater than a factor of 10.

25. The resonant converter circuit according to claim 13, wherein the stray inductance $L_s$ comprises more than 50% of a total circuit inductance.

26. The resonant converter circuit according to claim 13, wherein output pulses have a rise time with a voltage slew rate greater than $10^9$ V/s.

\* \* \* \* \*